United States Patent
Gieskes

(10) Patent No.: US 7,188,409 B2
(45) Date of Patent: Mar. 13, 2007

(54) METHOD FOR REJECTING COMPONENT DURING A PLACEMENT CYCLE

(75) Inventor: Koenraad Gieskes, Binghamton, NY (US)

(73) Assignee: Universal Instruments Corp., Binghamton, NY (US)

( * ) Notice: Subject to any disclaimer, the term of this patent is extended or adjusted under 35 U.S.C. 154(b) by 460 days.

(21) Appl. No.: 10/698,503

(22) Filed: Oct. 31, 2003

(65) Prior Publication Data

US 2005/0091845 A1    May 5, 2005

(51) Int. Cl.
*H05K 3/30*    (2006.01)
(52) U.S. Cl. .............. 29/833; 29/832; 29/834; 29/836; 29/740; 29/720; 29/721
(58) Field of Classification Search .......... 29/739–743, 29/759, 833–834; 414/737, 754; 901/31, 901/39; 294/64.2
See application file for complete search history.

(56) References Cited

U.S. PATENT DOCUMENTS

| | | | |
|---|---|---|---|
| 4,794,689 A * | 1/1989 | Seno et al. .................... | 29/740 |
| 5,345,514 A * | 9/1994 | Mahdavieh et al. ......... | 382/152 |
| 5,383,270 A * | 1/1995 | Iwatsuka et al. .............. | 29/840 |
| 6,879,869 B2 * | 4/2005 | Kou ........................... | 700/117 |
| 7,007,377 B2 * | 3/2006 | Noda et al. .................... | 29/833 |
| 2005/0091845 A1 * | 5/2005 | Gieskes ....................... | 29/833 |

* cited by examiner

*Primary Examiner*—Minh Trinh
(74) *Attorney, Agent, or Firm*—Schmeiser, Olsen & Watts

(57) ABSTRACT

The present invention features a method wherein a component in a multi-head component placement machine is rejected during the placement cycle. A component is imaged and the image processed using an automated vision system. The image processing determines whether the component is placeable based upon a comparison of the component image to preprogrammed mechanical parameters for the component. A non-placeable component is rejected into a reject station, which is contiguous with the head. Because a component can be rejected during the placement cycle, there is no slowdown of the placement machine cycle rate.

2 Claims, 6 Drawing Sheets

METHOD FOR REJECTING COMPONENT DURING A PLACEMENT CYCLE

FIELD OF THE INVENTION

This invention relates to component placement machines and, more particularly, to the rejection of a component during the placement cycle.

BACKGROUND OF THE INVENTION

The use of sophisticated placement machines in manufacturing printed circuit or similar cards, boards, panels, etc. is well known. The term printed circuit board (PCB) as used herein refers to any such electronic packaging structure. Typically, reels of tape-mounted circuit components are supplied to the placement machine by multiple feeders. Each feeder holds a reel of components and each feeder assembly provides components at a pick station. A housing carrying a rotatable frame having a plurality of pick/place heads, each pick/place head having a vacuum spindle equipped with a nozzle, may be moved in the X and Y axes in a plane above the PCB being populated. Each vacuum spindle may be moved in the Z-axis (i.e., in and out from an extended to a retracted position). Each nozzle is sized and otherwise configured for use with each different size and style of component to be placed by the machine.

In operation, the housing carrying the rotatable frame is moved to the pick station and the nozzle of one of the pick/place heads is positioned over the tape-mounted component. The nozzle is lowered, via its associated vacuum spindle, to a point where, upon application of vacuum, the component is removed from its backing tape and held tightly against the nozzle orifice. The component is then brought to a vision system where an image of the component is taken and processed. One or more images of the component is captured by the vision system.

Analysis of the image(s) determines whether the component is placeable. Typically, a placeability decision is based on a comparison of the image to predetermined mechanical parameters for each component. If the component is placeable, the rotatable frame is moved to a point over the printed circuit board being assembled and the component deposited on the printed circuit board at a predetermined location. If a component is non-placeable, it is rejected into a reject station. With multi-pick/place head machines, the need to reject components efficiently to improve cycle rate has become more critical. The mechanical parameters used for comparison may include, but are not limited to, lead length, lead width, lead spacing, component size, the number of leads, etc.

It is also known in the art to use a gripping mechanism that may be extended and retracted in place of the vacuum spindle and nozzle.

In the past, when the nozzle of a particular pick/place head carried a component deemed non-placeable, the entire housing and rotatable frame had to be moved in the X-Y plane to a designated reject station to release the component. This reject station may be a dump bucket, a reject feeder, or a matrix tray. Needless to say, as the entire multi-head rotatable frame needed to move, all other pick/place heads thereupon were prevented from picking and placing components during the trip to the reject station. This resulted in lower placement machine throughput because of this motion.

SUMMARY OF THE INVENTION

The present invention provides an improvement in the way that non-placeable components are handled in a component placement machine. During component rejection, wasted X-Y axis moves degrade machine assembly time. The inventive apparatus and method allows components to be rejected during each placement cycle by attaching a component reject station to the housing. In most cases, this eliminates wasted X-Y axis moves required to reject a non-placeable component. Therefore, when the reject station resides contiguous with the rotatable frame, the component rejection process in multi-head frames causes no slowdown of the placement machine cycle rate.

BRIEF DESCRIPTION OF THE DRAWINGS

A complete understanding of the present invention may be obtained by reference to the accompanying drawings, when considered in conjunction with the subsequent detailed description, in which:

FIG. 1b is a detailed, schematic perspective view of the pick-up and place head of FIG. 1a;

DESCRIPTION OF THE PREFERRED EMBODIMENT

The present invention pertains to rejection of a component in a component placement machine having a housing with a rotatable frame upon which multiple pick/place heads are mounted for assembling printed circuit boards. The inventive apparatus and method features an on-the-housing reject station for receiving rejected components so that there is no need for the rotatable frame to travel in the X-Y plane to a reject station to deposit one or more rejected components.

Figure 1A:
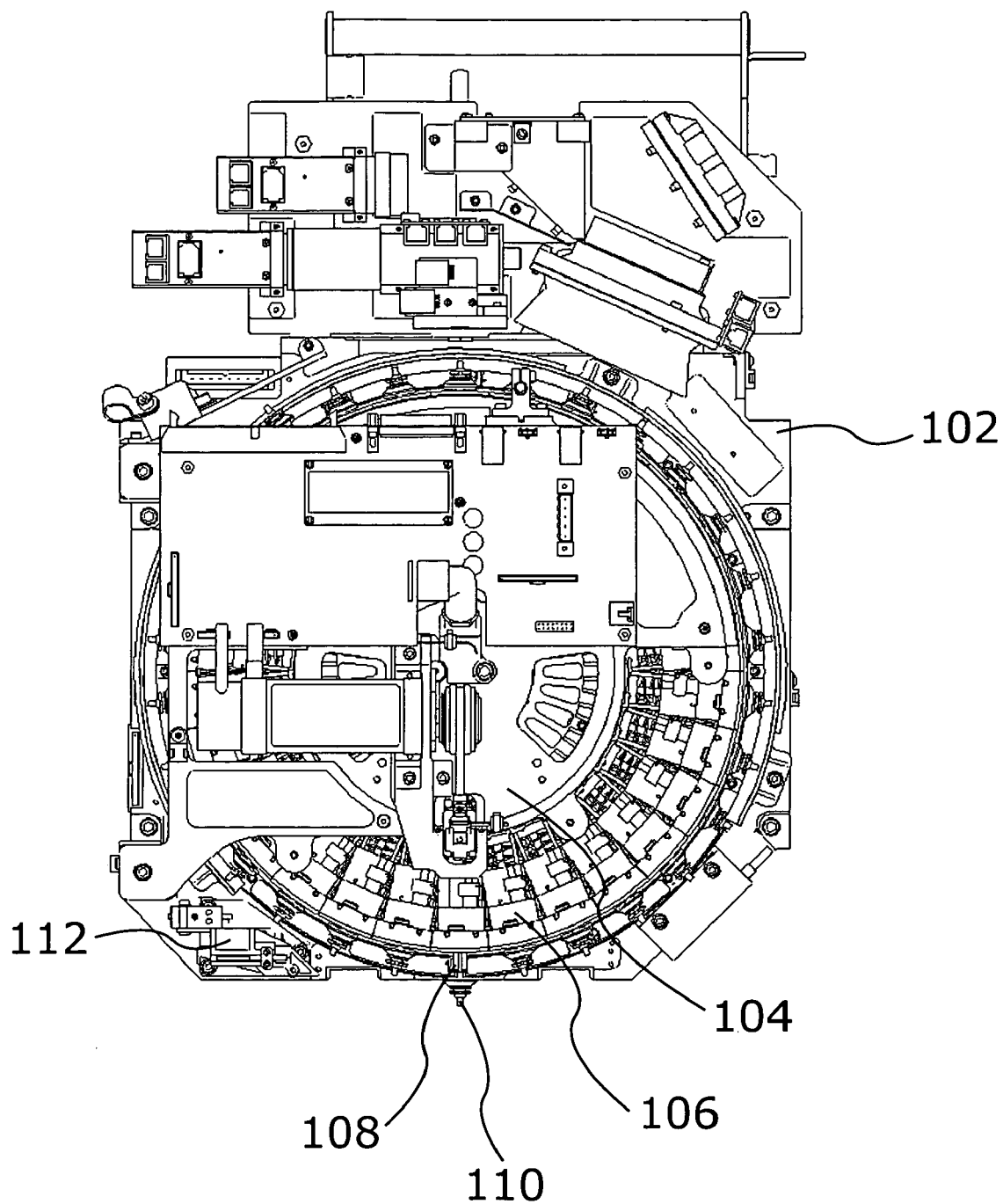
FIG. 1a is a detailed, schematic, front elevational view of the pick-up and place head of the invention.
Figure 1B:
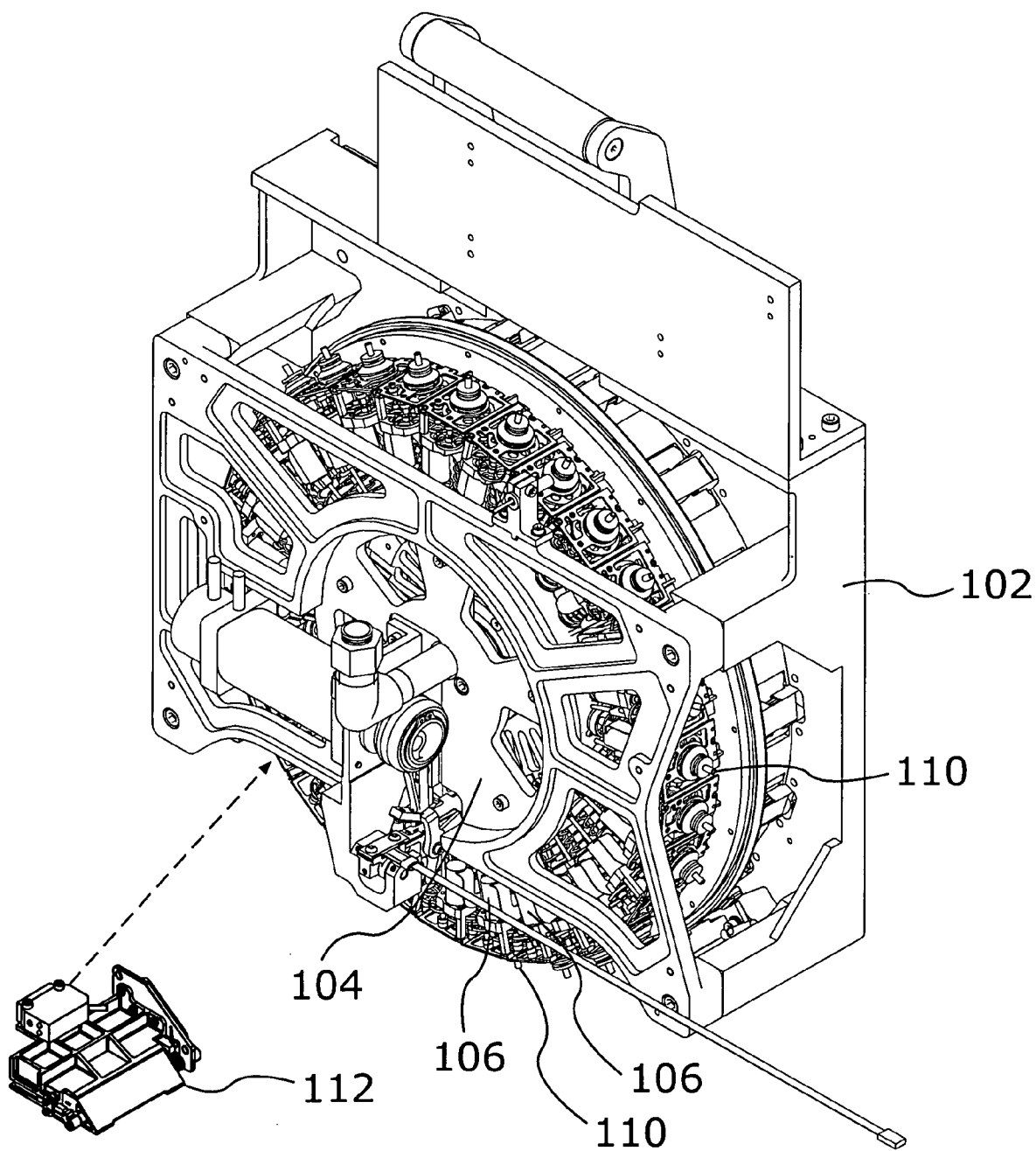
Figure 2:
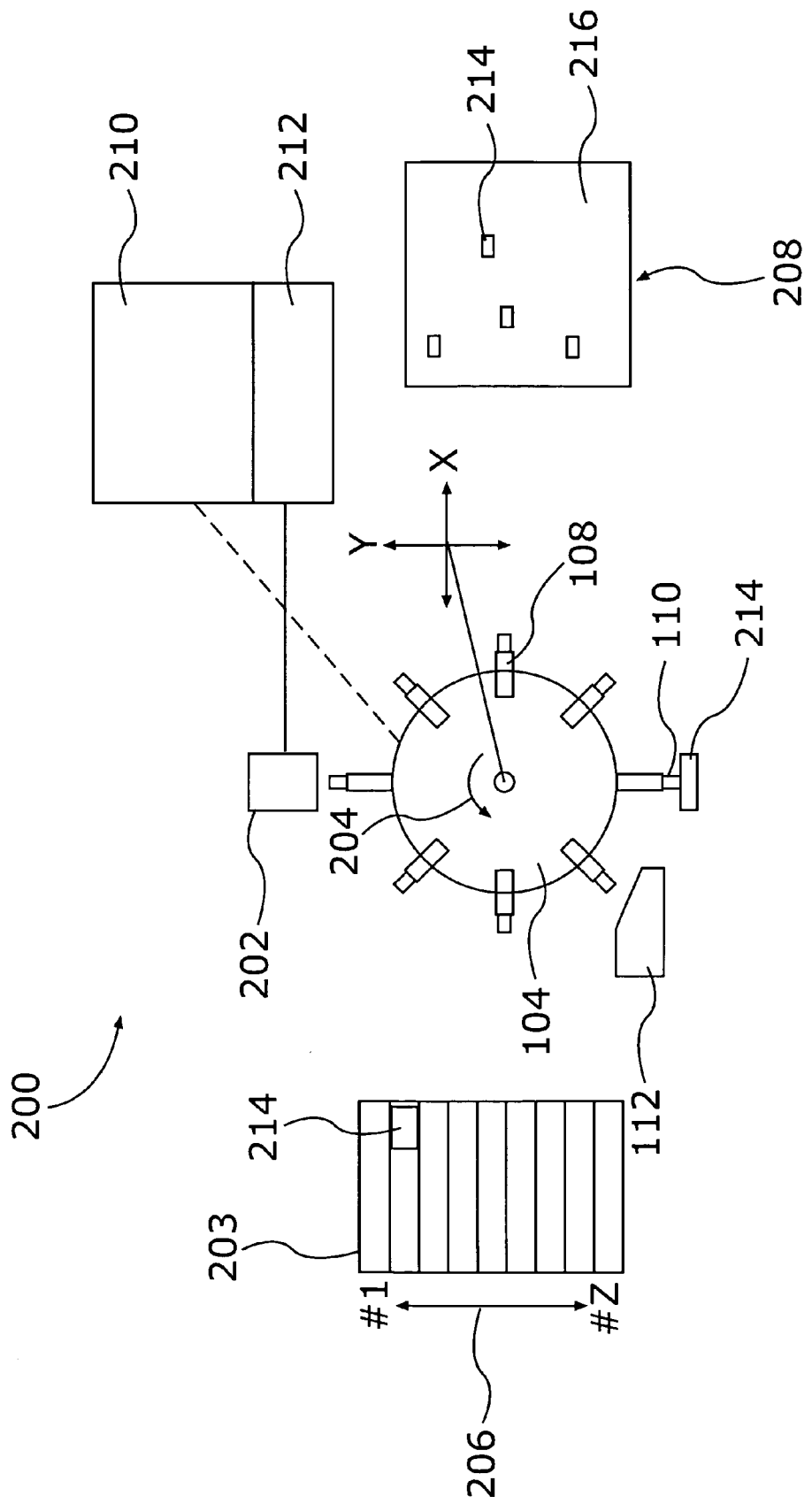
FIG. 2 is a simplified schematic block diagram of a portion of a component placement machine adapted to practice the method of the invention.

Referring first to FIGS. 1a and 1b, there are shown both elevational and perspective schematic views, respectively, of a typical multi-head rotatable frame for use in a component placement machine. The rotatable frame 104, having a plurality of pick/place heads 106 disposed around the periphery thereof, is mounted on housing 102. The rotatable frame 104 rotates around a central axis in the direction indicated by arrow 204 (FIG. 2). Each pick/place head 106 has a vacuum spindle 108 having a nozzle 110 at a distal end. The vacuum spindle 108 of each pick/place head 106 is movable along a Z-axis between an extended position and a retracted position. In its extended position, the nozzle 110 can pick up a component 214 (FIG. 2) at a pick station 203 (FIG. 2). Also shown is the on-the-housing reject station 112 which is disposed on the housing 102 adjacent to the rotatable frame 104.

Refer now also to FIG. 2. The pick station 203 provides a plurality of different component locations 206 from which a component 214 is selected in accordance with instructions provided, typically by a machine controller 210. Multi-pick/ place head rotatable frames 104 are known and the concept forms no part of the present invention. Such rotatable frames are described in U.S. Pat. Nos. RE. 35,027 and 4,458,412, as well as European Patent No. EP 0 315 799.

While the rotatable frame 104 is illustrated rotating around a horizontal axis, other configurations such as a carousel, not shown, rotating around a vertical axis may also be used to practice the inventive method. Consequently, the invention is not considered limited to the rotatable frame 104 configuration chosen for purposes of disclosure.

It is also known to use a vision system 212, typically having one or more cameras 202 disposed at a process station, not shown, of a component placement machine. Such vision systems 212 may be used to process images of components 214 to facilitate identifying, positioning, and manipulating or otherwise orienting the components 214 held against a nozzle 110 of a pick/place head 106. At least one camera 202 is disposed adjacent the rotatable frame 104 such that components 214 held on the nozzles 110 passing by the camera 202 are inspected. The camera 202 is used to capture images, not shown, often at different magnifications or with different lighting conditions. The output of the camera 202 is connected to electronic signal processing and control circuitry (i.e., a machine controller) 210.

The machine controller 210 controls the camera 202 and provides image capture functions. An output of the machine controller 210 is connected to a vision system 212. A place station 208 typically holds one or more printed circuit boards 216 onto which components 214 are placed. An on-the-housing reject station 112 is attached to the housing 102 to which the rotatable frame 104 is mounted such that components 214 rejected by the vision system 212 may be deposited therein.

The housing 102 to which the rotatable frame 104 is attached is typically movable in an X-Y plane allowing movement between the pick station 203 and the place station 208.

Figure 3:
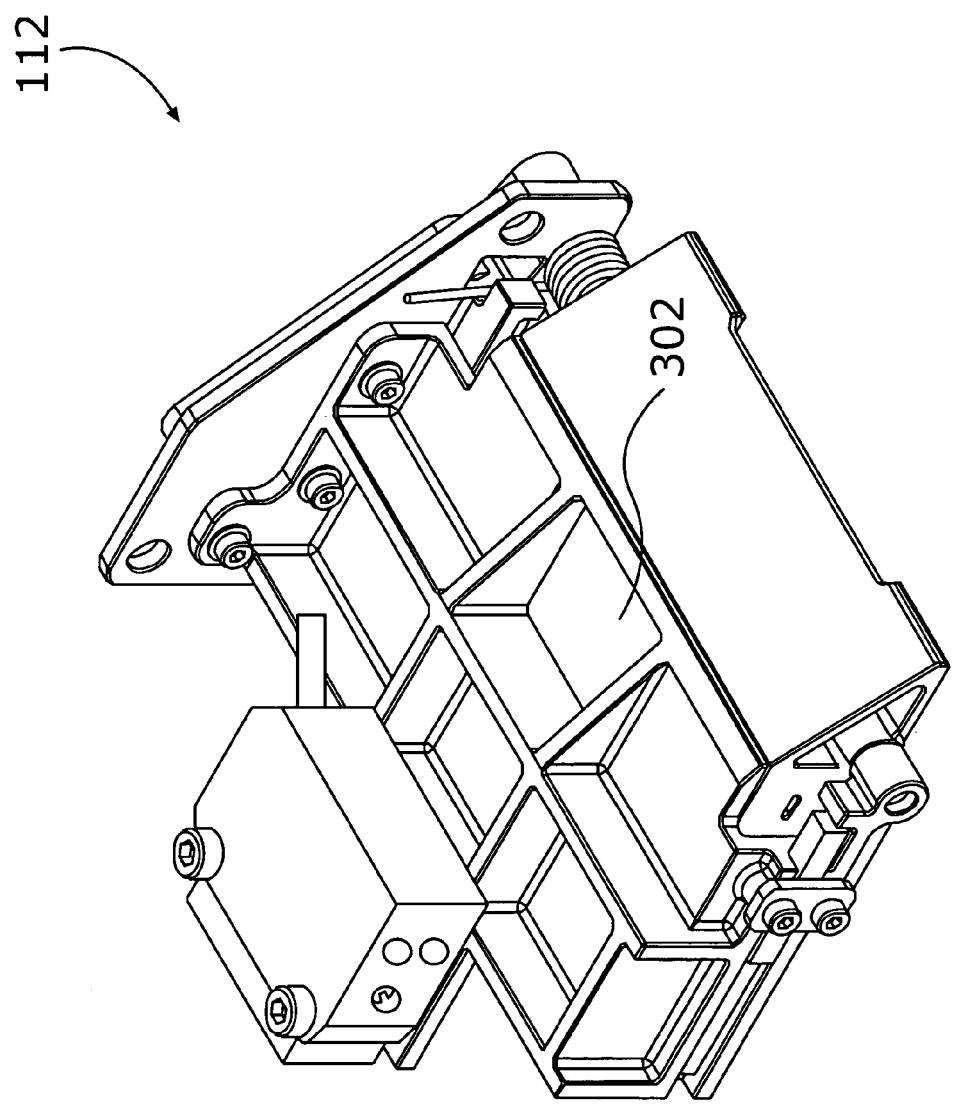
FIG. 3 is a detailed perspective view of an on-the-housing reject station of the pick-up and place head of FIGS. 1a and 1b.

Referring now to FIG. 3, there is shown a perspective view of one embodiment of the on-the-housing reject station 112. An opening 302 in the on-the-housing reject station 112 allows entry of rejected components 214.

The present invention takes advantage of the location of the on-the-housing reject station 112 to allow for rejection of a component 214 during the placement cycle performed by each nozzle 110 of the component placement machine. It will be recognized that many possible configurations exist for placing the on-the-housing reject station 112 in proximity to the rotatable frame 104 and that the invention is not considered limited to the embodiment detailed in FIG. 3.

The inventive method is operative with any number of pick/place heads 106 and is not considered limited to any particular number thereof. It will also be recognized that the timing data used for purposes of disclosure may vary depending on the actual design of the rotatable frame 104.

In the embodiment chosen for purposes of disclosure, it is assumed under worst-case circumstances that each active pick/place head 106 on the rotatable frame 104 may need to reject a component 214 during each placement cycle.

In operation, after a component 214 has been imaged by the camera 202 in cooperation with the machine controller 210, the image is processed by the vision system 212. The image analysis performed by the vision system 212 determines whether the component 214 is placeable. The placeability decision is typically based on a comparison of the image of the component 214 with predetermined mechanical parameters for the component 214. When the pick/place head 106 reaches the reject station, and the component 214 is determined to be non-placeable, the component 214 is released into the on-the-housing reject station 112. If, however, the component 214 is determined to be placeable, the nozzle 110 secures the component 214 until it reaches the place station 208 where the component 214 is placed on the printed circuit board 216 at its predetermined location.

It will also be recognized that, optionally, functional (i.e., electrical) testing may be performed on the components 214. The results of any such testing may also be used to identify a component 214 as non-placeable. There may be other testing or inspection which could be performed on components 214 and the inventive concept of on-the-housing mounting of the on-the-housing reject station 112 is not considered limited to the specific tests identified for purposes of disclosure.

Figure 4:
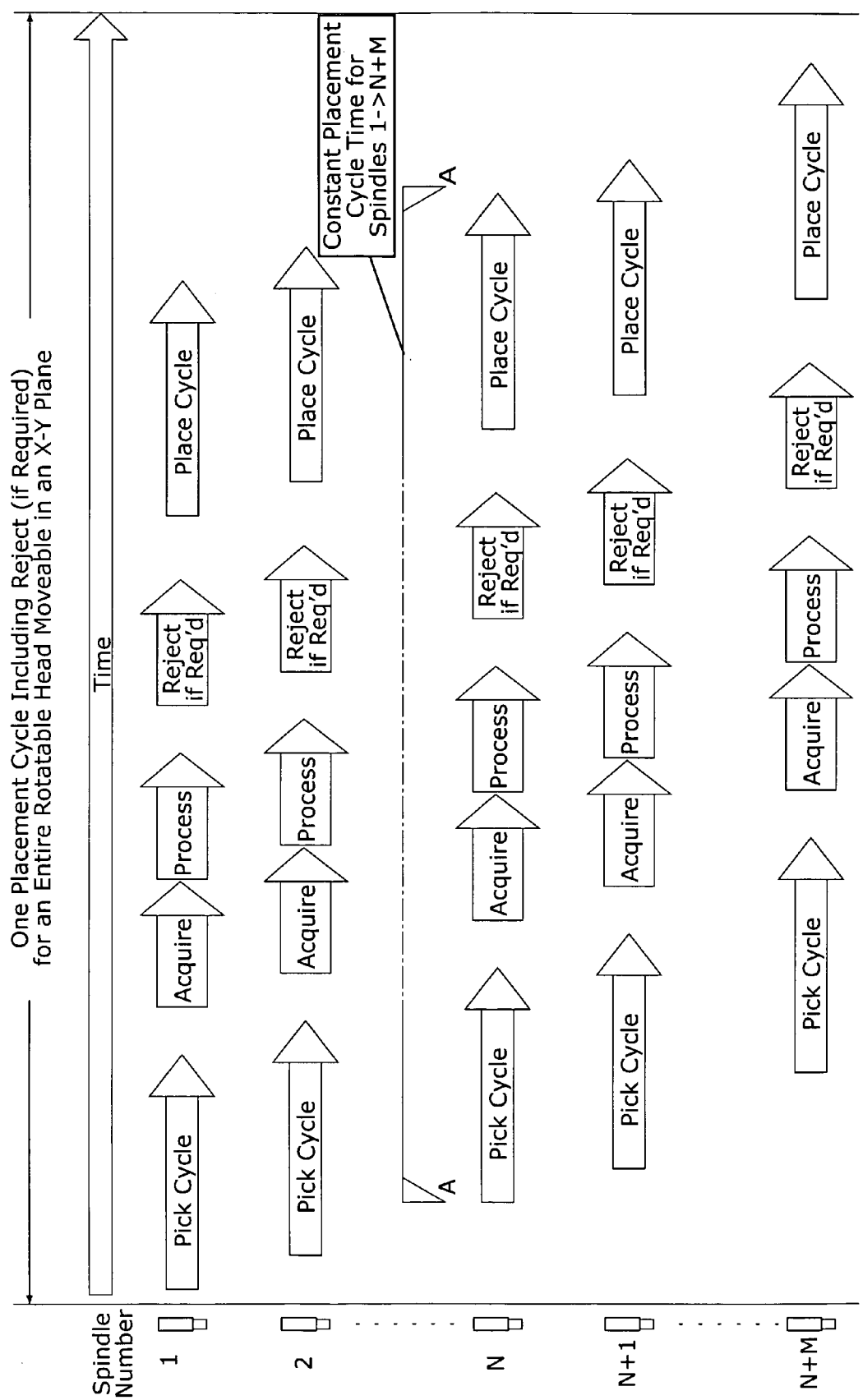
FIG. 4 is a timing diagram of the placement cycle time.

Referring now to FIG. 4, there is shown a timing diagram for component rejection within a placement cycle. As may be seen, rejection of a component 214 for each pick/place head 106 is always completed within a placement cycle. By keeping component rejection completely within a single machine placement cycle, the component placement machine's throughput is unaffected and the overall placement machine's throughput is improved over similar machines of the prior art.

Figure 5:
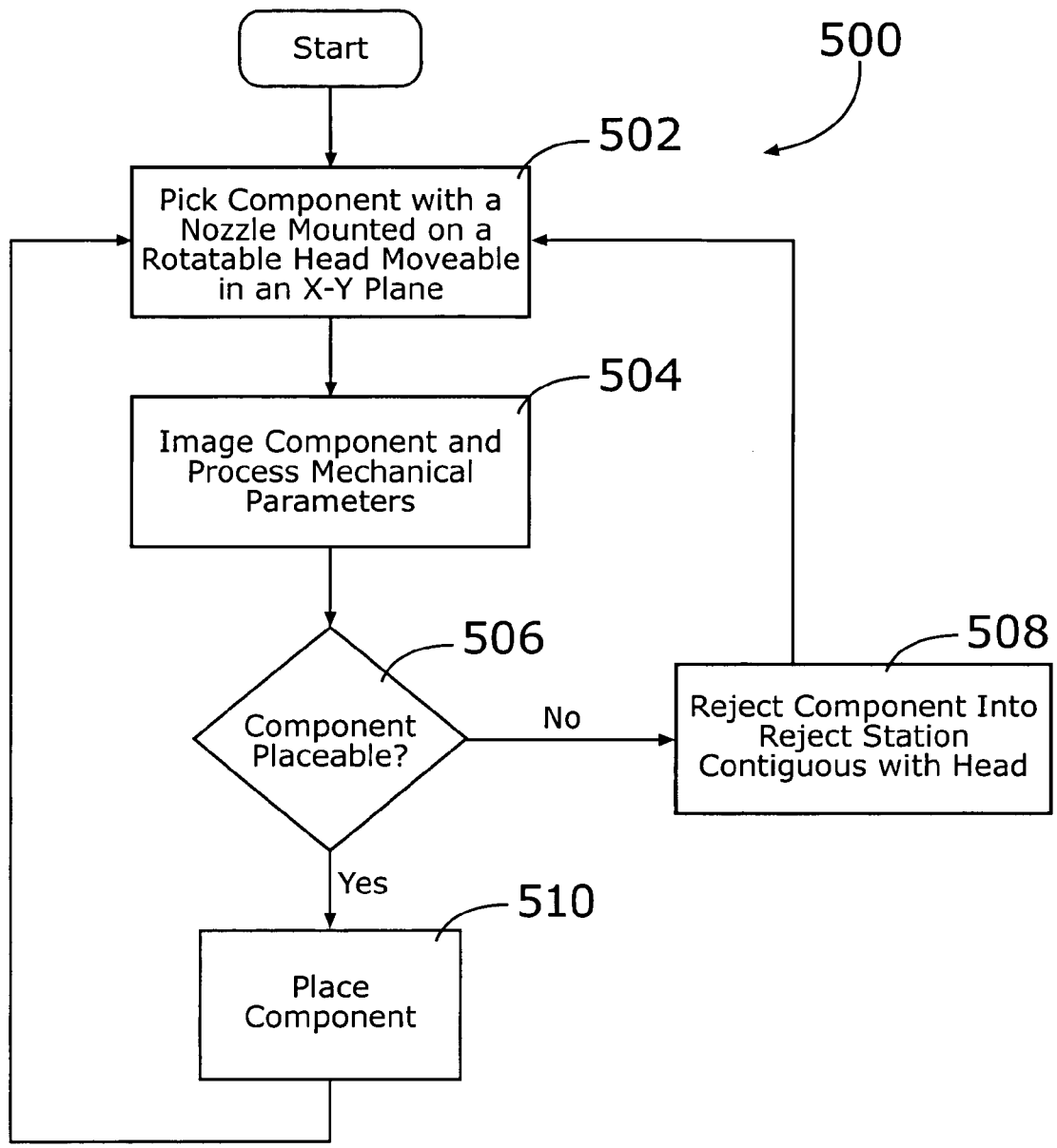
FIG. 5 is a simplified flow chart of the method of the invention.

Referring again to FIG. 1, FIG. 2, and also to FIG. 5, there is shown a flow chart 500 (FIG. 5) illustrating the steps of the inventive method. The rotatable frame 104 is first moved to a pick station 203, a particular nozzle 110 associated with a pick/place head 106 is lowered, and a component 214 is picked, step 502. This step is repeated for the number of pick/place heads 106 on the multi-head rotatable frame 104.

After component picking begins, the nozzles 110 holding a picked component 214 proceed to the camera 202 where the component 214 is imaged, and the vision system 212 processes the acquired image, step 504. Assuming that the component 214 is determined to be placeable based on a comparison of the image with the predetermined criteria for component 214, step 506, the rotatable frame 104 is moved under program control to the desired X-Y coordinates over the printed circuit board 216 being assembled at the place station 208. The nozzle 110 is lowered and the component 214 picked in step 502 is placed onto the printed circuit board 216, step 510.

If, however, the component 214 is determined to be unplaceable, step 506, when the pick/place head 106 carrying the unplaceable component 214 on its associated nozzle 110 has proceeded to a position adjacent the on-the-housing reject station 112, the component 214 is rejected (i.e., released from the nozzle 110 into the on-the-housing reject station 112), step 508.

Optionally, the on-the-housing reject station 112 may be equipped with one or more sensors (not shown) indicating that the on-the-housing reject station 112 is approaching a full state or has already reached a full state. Under program control, the frame 102 may then proceed to a dump station where the on-the-housing reject station 112 may be automatically emptied.

In alternate embodiments, the placement machine having the on-the-housing reject station 112 mounted on the housing 102 may have different reject options programmed. In one alternate embodiment, a component 214 being picked and placed by the component placement machine may be physically too large to be accommodated by the on-the-housing reject station 112. In this case, the placement machine may revert to prior art behavior and move the housing 102 along the X and Y axes to a reject station where each oversized component may be rejected.

Since other modifications and changes varied to fit particular operating requirements and environments will be apparent to those skilled in the art, the invention is not considered limited to the example chosen for purposes of disclosure, and covers all changes and modifications which do not constitute departures from the true spirit and scope of this invention.

Having thus described the invention, what is desired to be protected by Letters Patent is presented in the subsequently appended claims.

What is claimed is:

1. A method for rejecting at least a component during a placement cycle, comprising steps:
    a) providing a component placement machine including a housing adapted for movement along an X and a Y axis above a printed circuit board and having a frame rotatably attached thereto, said frame having a plurality of pick/place heads disposed thereupon;
    b) providing a vision system, including at least one camera contiguous with said housing;
    c) providing a reject station contiguous with said housing and adapted to receive said component;
    d) picking said component from a supply of components using at least one of said plurality of pick/place heads;
    e) capturing at least one image of said picked component, and processing said captured image to determine whether said picked component is a placeable component or a non-placeable component;
    f) placing said placeable component onto said printed circuit board at a predetermined location; and
    g) rejecting said non-placeable component into said reject station; and, repeating steps d to f for another component, wherein said rejecting step (g) is accomplished substantially completely during at least one of said repeated picking step (d), said repeated capturing step (e), and said repeated placing step (f) of said another component by another pick/place head of said plurality of pick/place heads.

2. The method for rejecting at least a component during a placement cycle as recited in claim 1, wherein said rejecting step (g) comprises means for releasing said non-placeable component from at least one of a plurality of said pick/place heads such that the said non-placeable component is deposited into said reject station.

* * * * *